United States Patent [19]

Lisco et al.

[11] Patent Number: 5,917,375
[45] Date of Patent: Jun. 29, 1999

[54] LOW DISTORTION AMPLIFIER CIRCUIT WITH IMPROVED OUTPUT POWER

[75] Inventors: Richard Joseph Lisco, Whippany; Wen Liu, Parsippany; Jerrold Moravchik, Tenafly, all of N.J.

[73] Assignee: Lucent Technologies Inc., Murray Hill, N.J.

[21] Appl. No.: 08/867,558

[22] Filed: Jun. 2, 1997

Related U.S. Application Data

[63] Continuation of application No. 08/525,809, Sep. 8, 1995, abandoned.

[51] Int. Cl.⁶ ........................................................ H03F 1/26
[52] U.S. Cl. ............................................. 330/151; 330/149
[58] Field of Search ............................... 330/52, 149, 151; 375/297; 455/63

[56] References Cited

U.S. PATENT DOCUMENTS

| | | |
|---|---|---|
| 4,583,049 | 4/1986 | Powell . |
| 4,629,996 | 12/1986 | Watanabe et al. ...................... 330/151 |
| 4,926,136 | 5/1990 | Olver . |
| 5,304,945 | 4/1994 | Myer . |

OTHER PUBLICATIONS

European Search Report, EP 96 30 6220, Dec. 6, 1996.

*Primary Examiner*—James B. Mullins

[57] ABSTRACT

A low distortion amplifier circuit employing a main amplifier and a correction amplifier in a feed-forward loop, is particularly adapted for amplifying multi-tone signals. The main amplifier produces fundamental frequency power along with undesirable distortion products. The correction amplifier provides correction signals at the distortion product frequencies to cancel the distortion products of the main amplifier. In addition, the correction amplifier produces fundamental frequency power which is combined with the fundamental frequency power of the main amplifier, thereby increasing the amplifier circuit output power.

18 Claims, 4 Drawing Sheets

| SIGNAL | FREQ. COMPONENT | VOLTAGE LEVEL | PHASE (DEGREES) |
|---|---|---|---|
| $S_{IN}$ | f1 | $V_1$ | N/A |
|  | f2 | $V_2$ |  |
| S1 | f1 | $C_{11} V_1$ | 0 |
|  | f2 | $C_{11} V_2$ | 0 |
| S2 | f1 | $\sqrt{1-C_{11}^2}\, V_1$ | 0 |
|  | f2 | $\sqrt{1-C_{11}^2}\, V_2$ | 0 |
| S3 | f1 | $G1\, C_{11} V_1$ | $-\phi_{10}$ |
|  | f2 | $G1\, C_{11} V_2$ | $-\phi_{20}$ |
|  | f3 | $V_3$ | 0 |
|  | f4 | $V_4$ | 0 |
| S4 | f1 | $C_{22}(G1\, C_{11} V_1)$ | $-\phi_{11}$ |
|  | f2 | $C_{22}(G1\, C_{11} V_2)$ | $-\phi_{21}$ |
|  | f3 | $C_{22} V_3$ | $-\phi_{31}$ |
|  | f4 | $C_{22} V_4$ | $-\phi_{41}$ |
| S5 | f1 | $C_{22}(G1\, C_{11} V_1)$ | $-\phi_{11}-180$ |
|  | f2 | $C_{22}(G1\, C_{11} V_2)$ | $-\phi_{21}-180$ |
|  | f3 | $C_{22} V_3$ | $-\phi_{31}-180$ |
|  | f4 | $C_{22} V_4$ | $-\phi_{41}-180$ |
| S6 | f1 | $\sqrt{1-C_{11}^2}\, V_1$ | $-\phi_{11}$ |
|  | f2 | $\sqrt{1-C_{11}^2}\, V_2$ | $-\phi_{21}$ |
| S7 | f1 | $\left(\sqrt{1-C_{33}^2}\sqrt{1-C_{11}^2} - C_{33} C_{22} C_{11} G1\right) V_1$ | $-\phi_{11}-90$ |
|  | f2 | $\left(\sqrt{1-C_{33}^2}\sqrt{1-C_{11}^2} - C_{33} C_{22} C_{11} G1\right) V_2$ | $-\phi_{21}-90$ |
|  | f3 | $C_{33} C_{22} V_3$ | $-\phi_{31}-270$ |
|  | f4 | $C_{33} C_{22} V_4$ | $-\phi_{41}-270$ |

Fig. 3

| SIGNAL | FREQ. COMPONENT | VOLTAGE LEVEL | PHASE (DEGREES) |
|---|---|---|---|
| S8 | f1<br>f2<br>f3<br>f4 | $\sqrt{1-C_{22}^2}\,(G1\,C_{11}\,V_1)$<br>$\sqrt{1-C_{22}^2}\,(G1\,C_{11}\,V_2)$<br>$\sqrt{1-C_{22}^2}\,V_3$<br>$\sqrt{1-C_{22}^2}\,V_4$ | $-\phi_{11}$<br>$-\phi_{21}$<br>$-\phi_{31}$<br>$-\phi_{41}$ |
| S9 | f1 | $\left(\sqrt{1-C_{33}^2}\sqrt{1-C_{22}^2} - C_{33}\,C_{22}\,C_{11}\,G1\right)V_1\,G2$ | $-\phi_{11}-90-\phi_{A21}$ |
|  | f2 | $\left(\sqrt{1-C_{33}^2}\sqrt{1-C_{22}^2} - C_{33}\,C_{22}\,C_{11}\,G1\right)V_2\,G2$ | $-\phi_{21}-90-\phi_{A22}$ |
|  | f3<br>f4 | $\sqrt{1-C_{22}^2}\,V_3$<br>$\sqrt{1-C_{22}^2}\,V_4$ | $-\phi_{31}-270-\phi_{A23}$<br>$-\phi_{41}-270-\phi_{A24}$ |
| S10 | f1<br>f2<br>f3<br>f4 | $\sqrt{1-C_{22}^2}\,(G1\,C_{11}\,V_1)$<br>$\sqrt{1-C_{22}^2}\,(G1\,C_{11}\,V_2)$<br>$\sqrt{1-C_{22}^2}\,V_3$<br>$\sqrt{1-C_{22}^2}\,V_4$ | $-\phi_{11}-90-\phi_{A21}$<br>$-\phi_{21}-90-\phi_{A22}$<br>$-\phi_{31}-90-\phi_{A23}$<br>$-\phi_{41}-90-\phi_{A24}$ |
| $S_{out}$ | f1<br>f2 | $1.414\,G1\,C_{11}\,V_1\sqrt{1-C_{22}^2}$<br>$1.414\,G1\,C_{11}\,V_2\sqrt{1-C_{22}^2}$ | N/A |

*Fig. 4*

LOW DISTORTION AMPLIFIER CIRCUIT WITH IMPROVED OUTPUT POWER

This application is a continuation of application Ser. No. 08/525,809, filed on Sep. 8, 1995, now abandoned.

FIELD OF THE INVENTION

The present invention relates generally to low distortion, high frequency amplifier circuits. More particularly, the invention relates to a high output power, feed forward amplifier circuit for amplifying a multi-tone input signal while producing only minimal intermodulation distortion products.

BACKGROUND OF THE INVENTION

In the amplification of a multi-tone high frequency input signal such as in wireless communications applications, undesirable intermodulation frequencies are typically produced, resulting in distortion of the output signal. A conventional technique for reducing this intermodulation distortion (IMD) has been to employ an additional correction amplifier to provide correction signals at the same distortion frequencies as the intermodulation (IM) products. The correction signals are generally provided at phases that are 180° opposite those of the corresponding IM products so that the IM products and correction signals can be applied to an output combiner where they are cancelled because of the vector summation of the signals in the combiner. The amplified output signal, which also flows through the output combiner, then consists substantially of the fundamental input signal frequencies, i.e., the multi-tone components of the input signal.

Figure 1:
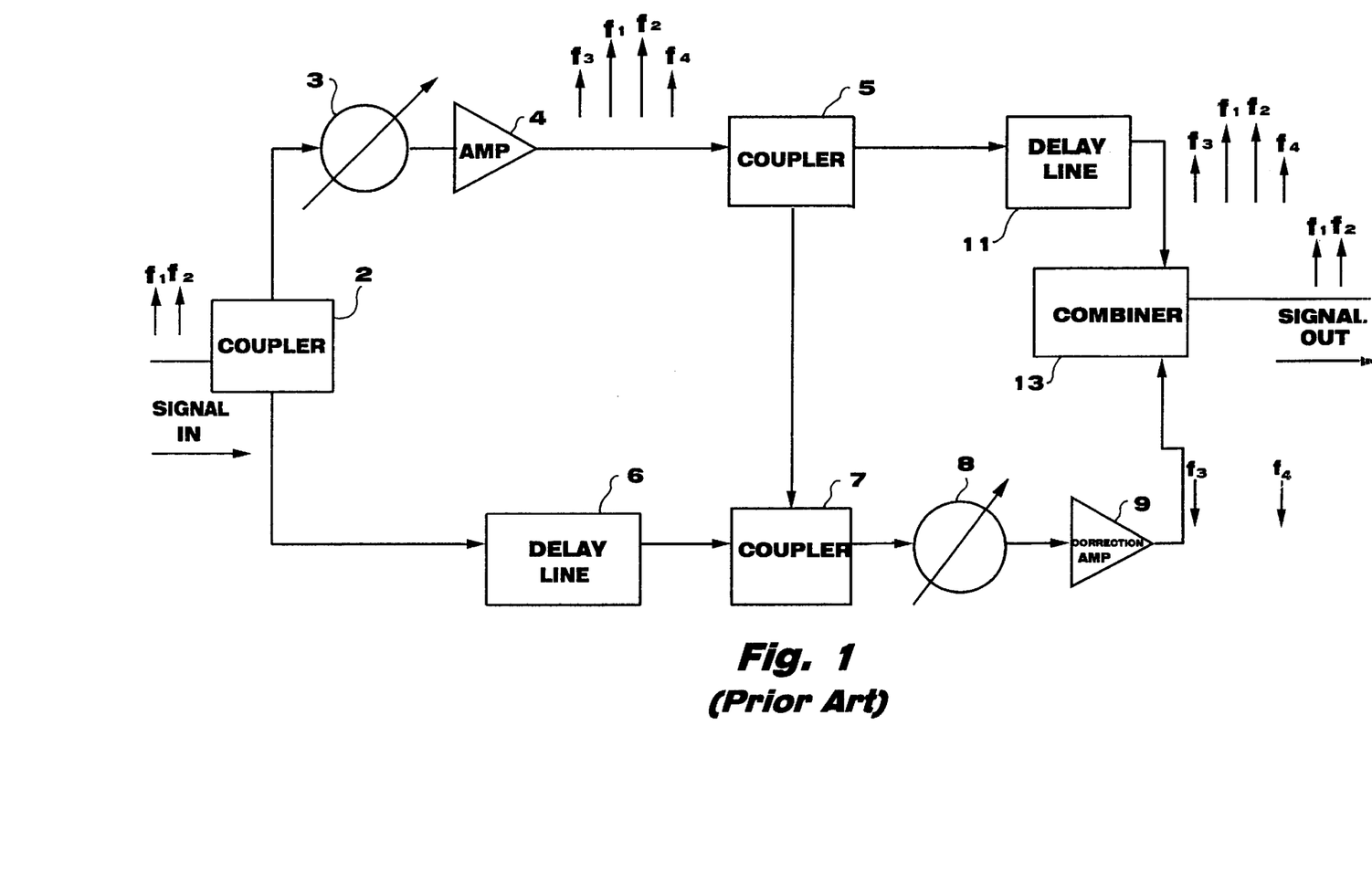
FIG. 1 depicts a schematic diagram of a prior art feed forward amplifier circuit.

A conventional feed forward low distortion amplifier circuit is depicted in FIG. 1. With this circuit, correction signals are generated by first applying a multi-tone input signal to an input coupler or power divider 2 where it is split into two signals. One of these signals is applied through a phase shifter 3 to a main amplifier 4 that amplifies the multiple tones but in the process produces the undesirable distortion products (or IM products). Coupler 5 is then utilized at the output of main amplifier 4 to couple a portion of the amplified signal (fundamental plus IM products) towards an input port of a subtracting coupler 7. Meanwhile, the other split signal from input coupler 6 is delayed by a delay line 6 and applied to the other input port of coupler 7. When the fundamental frequency components at both inputs of coupler 7 are at properly selected power levels and 180° out of phase, the fundamental frequencies cancel within coupler 7 so that the output of coupler 7 consists entirely of the IM products. These IM products are then applied to a phase shifter 8 and amplified by a correction amplifier 9. The correction amplifier output which consists entirely of the IM products, is applied to one input of an output combiner 13. The other input to output combiner 13 is the amplified signal output from main amplifier 4, which has been channeled through coupler 5 and delay line 11. By adjusting the gain of the correction amplifier as well as the phase shift of the correction signals, the IM products can be cancelled within the output combiner resulting in a substantially distortion free output signal.

An example of a low distortion amplifier which generally employs the above described technique is found in U.S. Pat. No. 5,304,945 entitled "Low-Distortion Feed-Forward Amplifier", and assigned to the assignee herein. The circuit in this patent employs two correction amplifiers and correction loops to further reduce distortion products. The techniques disclosed therein rely on the complete cancellation of the fundamental frequency components in a pair of couplers to produce the optimum correction signals.

U.S. Pat. No. 4,583,049 entitled "Feed-Forward Circuit" discloses a similar distortion product cancellation technique for a single tone input signal. Therein, the single tone input signal is split by an input coupler, with one of the coupler outputs applied to a main amplifier. Amplification at the main amplifier produces undesirable spurious signals on both sides of the carrier. These spurious signals are cancelled using essentially the same technique described above in reference to FIG. 1 for the multi-tone case, except that the phase shift vs. frequency is more accurately controlled in the various paths within the circuit.

SUMMARY OF THE INVENTION

In a preferred embodiment of the present invention, there is provided a low distortion amplifier circuit of the type employing a main amplifier and a correction amplifier in a feed-forward loop, which amplifier circuit is particularly useful for amplifying multi-tone signals. The main amplifier amplifies a multi-tone input signal to produce amplified fundamental frequency power along with undesirable distortion products. The correction amplifier provides correction signals at the distortion product frequencies to cancel the undesirable distortion products of the main amplifier. In addition, the correction amplifier amplifies the multi-tone input signal which is combined with the amplified multi-tone input signal of the main amplifier, thereby increasing the total amplification capability of the circuit.

As a result, output power shortcomings of the prior art amplifier circuits described above can be overcome with a typical embodiment of the present invention. That is, the one or more correction amplifiers employed in those prior art circuits functioned solely to provide correction signals and not to enhance the output power at the fundamental frequencies. Indeed, the employment of the correction loop in those prior art circuits reduced the fundamental frequency output power by virtue of the power losses and coupling losses in the components following the main amplifier. In a preferred embodiment of the present invention, fundamental frequency output power is substantially twice as high as would otherwise be available with the prior art circuit arrangements, while circuit complexity is kept low. In addition, by employing the same or highly similar amplifiers for the main amplifier and correction amplifier, and by applying substantially the same input power to the two amplifiers, superior temperature stability is realizable.

In one embodiment of the invention, an input signal having at least one fundamental frequency is applied to a first coupler where it is split into first and second signals. The first signal is applied to a main amplifier where it is amplified and where undesirable distortion products are produced. The main amplifier output signal is then applied to a second coupler to provide a coupled signal and a direct signal, each being analog replicas of the main amplifier output signal. The second signal and coupled signal are applied to respective first and second inputs of a third coupler at a predetermined relative phase relationship. The third coupler then subtracts fundamental frequency signal energy of the coupled signal from that of the second signal to provide a third signal that contains both the fundamental frequencies and distortion product frequencies. The third signal is applied to a correction amplifier where it is amplified to produce a correction amplifier output signal, which is in turn applied to a first input of an output combiner. The direct signal is applied to a second input of the output combiner. The phase relationship between the corresponding frequency components of the direct signal and of the correction amplifier output signal are such that the distortion products cancel, while the fundamental frequency components add in phase. As a result, an amplifier circuit output signal is produced in which the fundamental frequency output signal is larger than that of the main amplifier output, while the distortion products are substantially cancelled.

BRIEF DESCRIPTION OF THE DRAWINGS

For a full understanding of the present invention, reference is had to an exemplary embodiment thereof, considered in conjunction with the accompanying drawings, for which.

DETAILED DESCRIPTION OF THE INVENTION

The amplifier circuit of an exemplary embodiment of the present invention will be described below for convenience as a low distortion amplifier for amplifying a high-frequency, dual-tone input signal. It is understood, however, that the invention is equally applicable to low distortion amplification of input signals having more than two tones. Moreover, the invention may be used for low distortion amplification of a single tone input signal in cases where the amplifier element used would otherwise tend to produce undesirable spurious signals.

Figure 2:
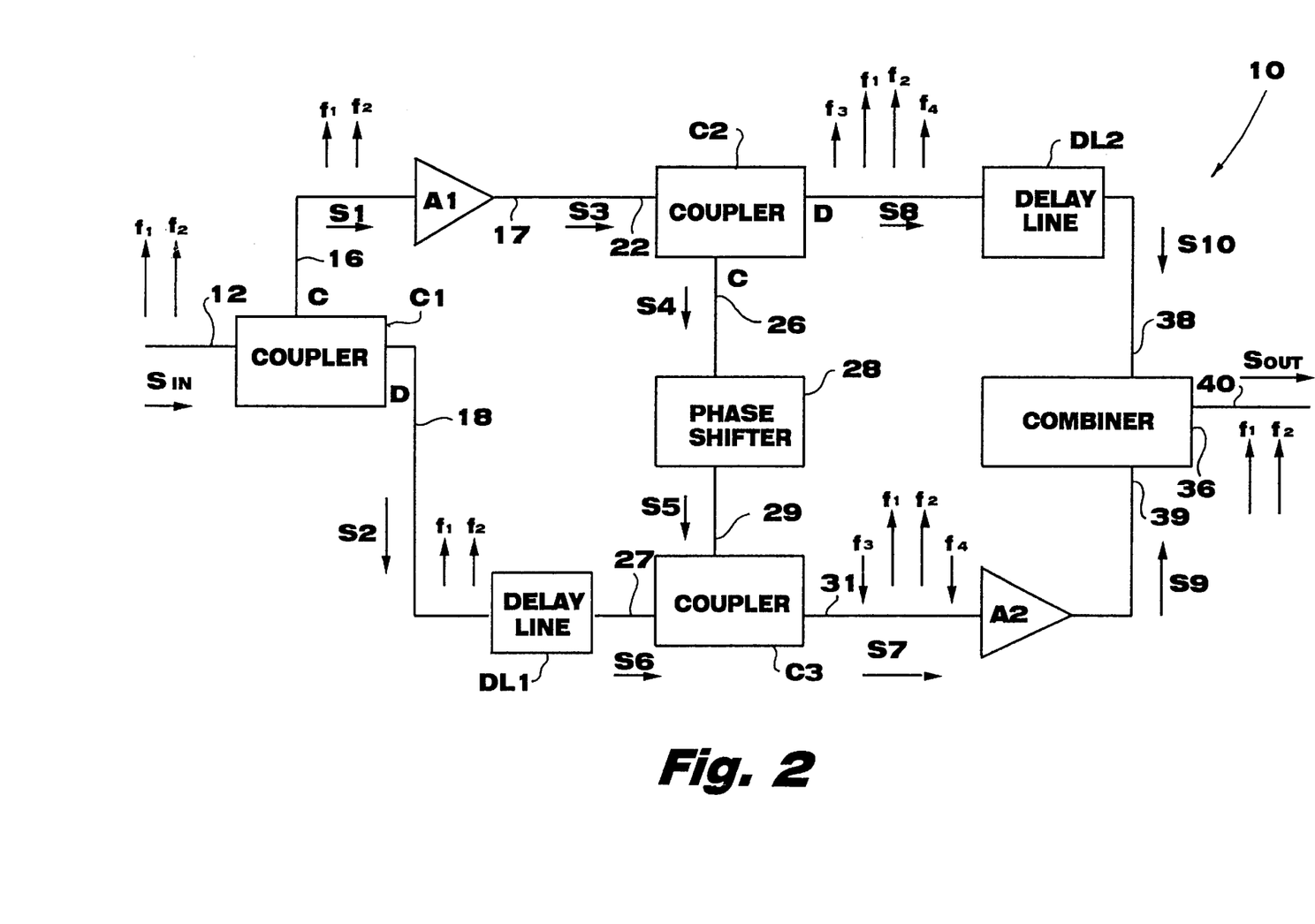
FIG. 2 is a schematic circuit diagram of an amplifier circuit in accordance with the present invention.

FIG. 2 shows a low distortion amplifier circuit 10 in accordance with the present invention, for linearly amplifying an input signal $S_{in}$ to produce an output signal $S_{out}$. In the exemplary embodiment of FIG. 2, the input signal $S_{in}$ is a dual-tone high-frequency signal consisting of sinusoidal components at a first fundamental frequency f1 and at a second fundamental frequency f2 higher than f1. Both frequencies f1 and f2 may lie within standard wireless communications frequency bands in the 800–960 MHz vicinity; however, it is understood that the invention is also useful at higher and lower frequencies. The frequency components such as f1 and f2 of $S_{in}$ and of various other signals shown in FIG. 2, are shown in a vectorial fashion in order to conveniently illustrate phase relationships between the same frequency components at various points within circuit 10. Thus a vector pointing in an upwards direction represents a frequency component of the opposite phase as the same frequency component represented by a downwardly pointed vector.

Input signal $S_{in}$ is applied to input port 12 of a first coupler or power splitter C1 which splits signal Sin into signal S1 at a "coupled path" output port 16 and a signal S2 at a "direct path" output port 18. Coupler C1 is preferably a passive device which may be a conventional branch line coupler or Wilkinson type divider that splits input power unequally between the two output ports, preferably with higher power being provided at port 18. For example, the signal level of signal S2 may be 1 to 10 dB higher than that of signal S1. Signal S1 contains only the frequency components f1 and f2, and is applied to power amplifier A1 where it is amplified to produce an amplified signal S3 at amplifier output port 17.

Amplifier A1 may be a conventional high frequency amplifier operating in class A, AB or B with power gain on the order of 30 dB to produce RF output power on the order of 50 W, for example. Suitable amplifiers for this purpose are known in the art and are commercially available from a variety of manufacturers.

Amplified signal S3 contains amplified frequency components f1 and f2 as well as undesirable intermodulation distortion (IMD) products at frequencies f3 and f4, where f3 is typically a lower frequency than f1 and f4 is a higher frequency than f2. As is well known, when a dual or multi-tone input signal is applied to an amplifier, which is not perfectly linear, IMD products are generated at predictable frequencies. These undesirable IMD products are particularly apparent when the amplifier is being operated in saturation or in the gain compression region of the amplifier. The further into the gain compression region the amplifier is operated, the higher will be the IMD product levels. In addition, amplifiers which operate in class AB or class B modes tend to produce high IMD product levels when multi-frequency input signals are amplified. IMD product levels on the order of −30 dBc (30 decibels below the fundamental frequency or carrier level) are typical.

Referring now to the tables of FIGS. 3–4 in conjunction with circuit 10 shown in FIG. 2, the voltage and phase relationships between the various signals within circuit 10 will now be described in more detail. To simplify the following discussion, the power and voltage standing wave ratio (VSWR) losses within the various components of circuit 10 will be ignored—one skilled in the art can readily compensate for these losses to optimize circuit performance. Beginning with input signal $S_{in}$, this signal has sinusoidal components at frequencies f1 and f2 at voltage levels of $V_1$ and $V_2$, respectively. The phase of $S_{in}$ is arbitrary for this discussion. Signal S1 has components at f1 and f2 with voltage levels of $C_{11} V_1$ and $C_{11} V_2$, respectively, where $C_{11}$ is the coupling value of coupler C1. The phase of the S1 components at f1 and f2 is defined to be at zero degrees. Similarly, signal S2 has sinusoidal components at frequencies f1 and f2 with voltage levels of $V_1\sqrt{1-C_{11}^2}$ and $v_2\sqrt{1-C_{11}^2}$, respectively, with the phase of these frequency components also assumed to be zero degrees. Signal S3 has components at frequencies f1 and f2 with voltage levels of $G1C_{11}V_1$ and $G1C_{11}V_2$, respectively, where G1 is the voltage gain of amplifier A1. The phases of the f1 and f2 components of S3 are $-\phi_{10}$ and $-\phi_{20}$, respectively, where $-\phi_{10}$ and $-\phi_{20}$ represent the insertion phase lags through amplifier A1 at the respective frequencies f1 and f2. (The minus sign indicates a phase lag). Signal S3 also contains distortion components at f3 and f4 at respective voltage levels $V_3$ and $V_4$, with reference phase values of zero degrees.

Figure 3:
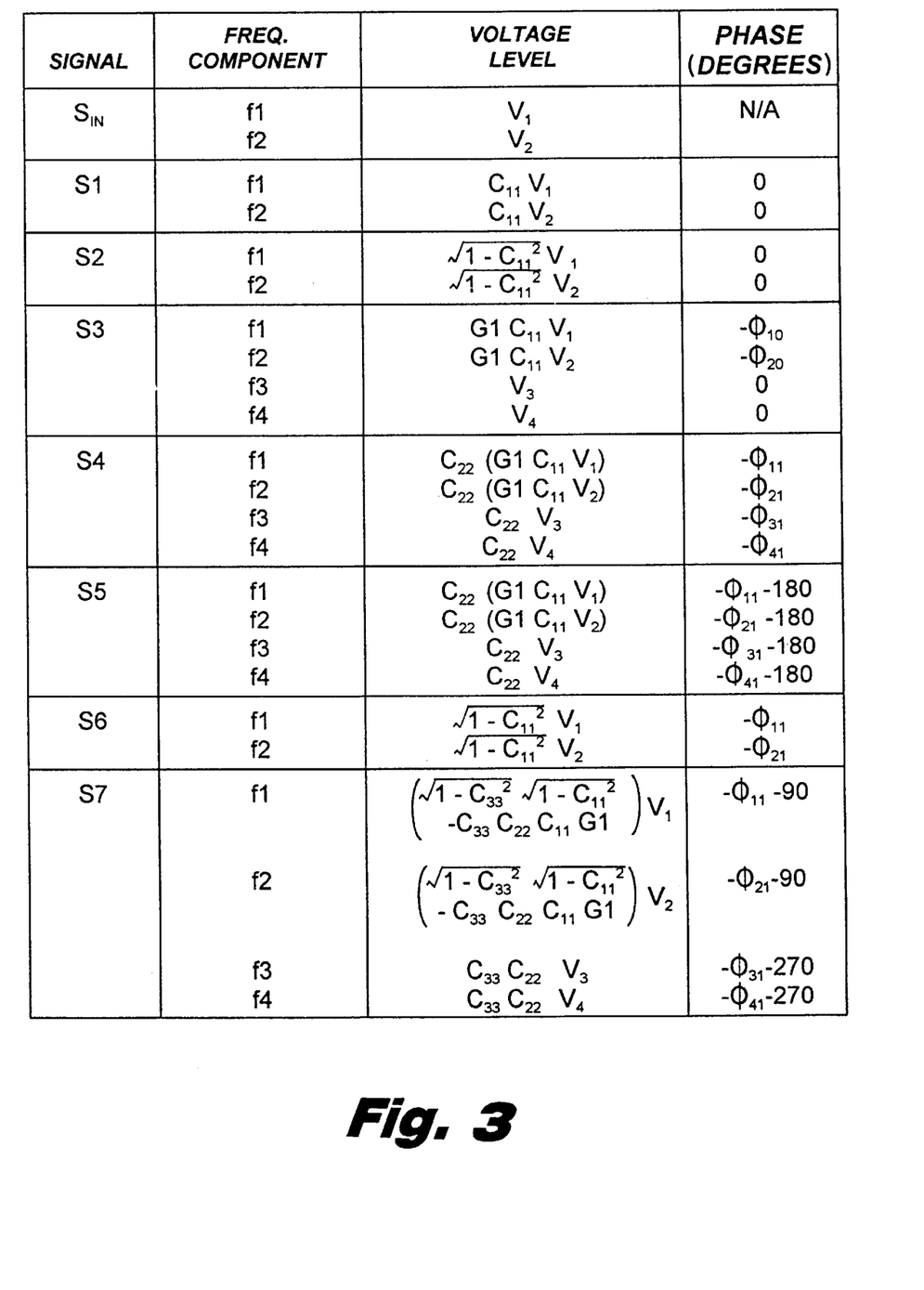
FIGS. 3–4 are tables depicting the relative amplitude and phase relationships among the various signals flowing within the circuit of FIG. 2.
Figure 4:
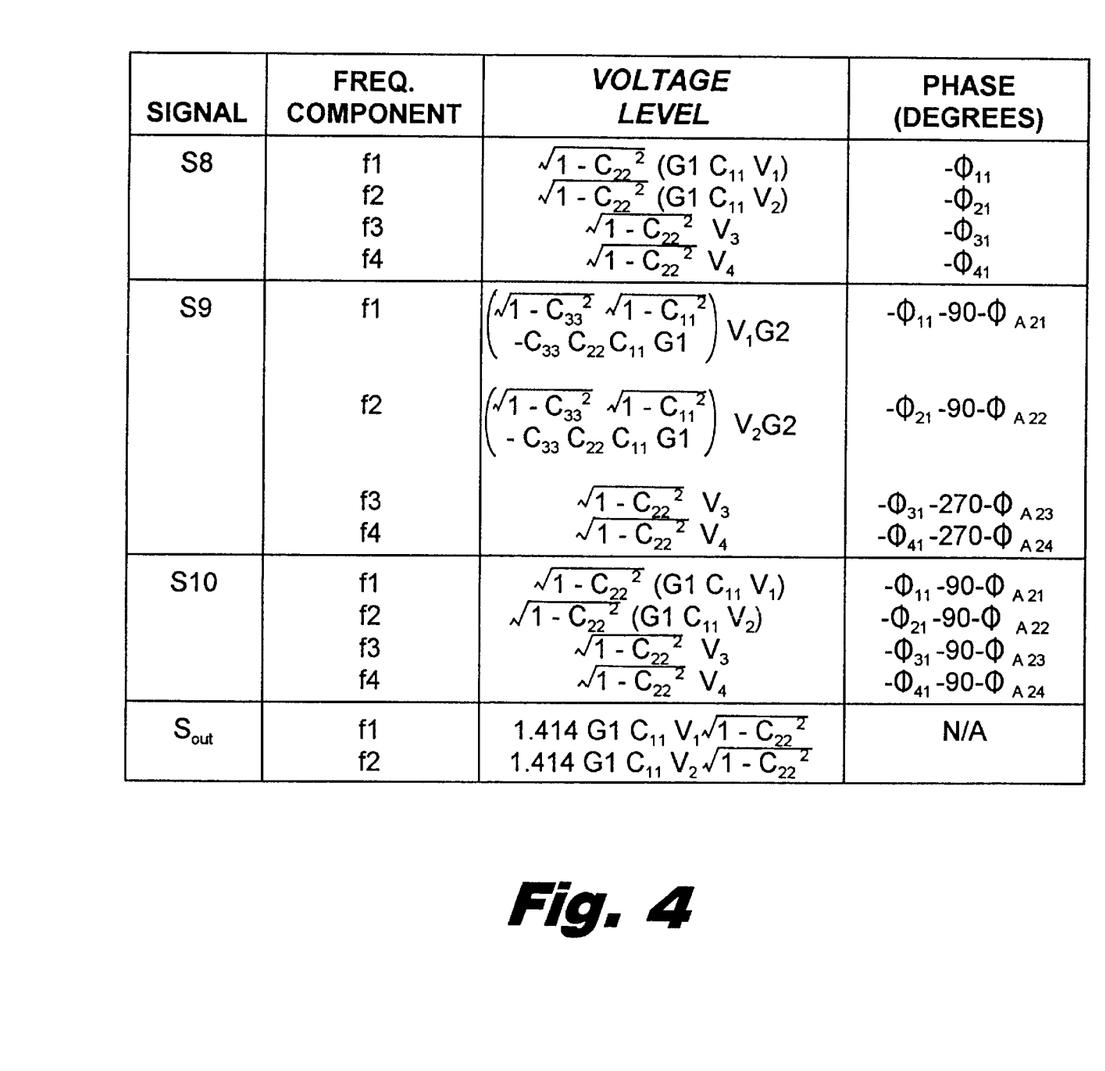

With continuing reference to FIGS. 2–4, signal S3 is applied to input port 22 of coupler C2, which may be a conventional hybrid (e.g., branch line), backward firing or Wilkinson coupler with a coupling value $C_{22}$, preferably in the range of −10 to −20 dB. In this case, coupled path signal S4 on output coupling port 26 will be 10 to 20 dB below the level of direct path signal S8 emanating from direct port 24. The voltage levels of the frequency components of signal S4 are each $C_{22}$ times the corresponding voltage levels of the S3 frequency components. Likewise, the voltage levels of S8 are $\sqrt{1-C_{22}^2}$ times the corresponding voltage levels of the S3 frequency components. In addition, the phase of the corresponding frequency components f1–f4 of both S4 and S8 are the same—i.e., $-\phi_{11}$ to $-\phi_{41}$, respectively. Phase values $-\phi_{11}$ and $-\phi_{12}$ represent the combination of the insertion phase lags $-\phi_{10}$ and $-\phi_{20}$, respectively, plus the insertion phase lags at the respective frequencies f1 and f2 through coupler C2. Phase values $-\phi_{31}$ and $-\phi_{41}$ merely represent the insertion phase lags at the respective frequency f3 or f4 through coupler C2. The phases of the frequency components of S4 will be equal to the corresponding ones of S8 when, for instance, an "in-phase" coupler such as an unequal split Wilkinson divider is used for coupler C2. If a branch line or other hybrid coupler is used for C2, then the signals S4 and S8 will differ in phase by 90°, which can be easily compensated for elsewhere in circuit 10.

Coupled path signal S3 is then applied to phase shifter 28, which in the present example is designed to introduce a 180° phase shift at each of the frequencies f1–f4. A myriad of commercially available phase shifters from a variety of manufacturers would be suitable for the purpose of providing a flat phase shift vs. frequency over specific frequency bands of interest. Examples of widely available phase shifts include variable capacitor type phase shifters, PIN diode phase shifters, and Shiffman phase shifters. The narrower the frequency range between the frequencies f3 to f4, the closer will be the performance of phase shifter 28 to the ideal case in which a perfect 180° shift is introduced at all frequencies of interest. Indeed, if only a very narrow frequency band is being utilized, a single half-wavelength long fixed transmission line may be suitable for phase shifter 28.

In any case, a signal S5 flowing out of phase shifter 28 towards coupled port 29 of coupler C3 contains the same frequency components f1 to f4 of signal S4, each phase shifted by 180°, and at the same voltage levels (minus the loss of the phase shifter 28 which is being ignored for this discussion). Thus, the f1 and f2 component voltage levels of signal S5 are $C_{22}G1C_{11}V1$ and $C_{22}G1C_{11}V2$, respectively, with phases of $-\phi_{11}-180°$, and $-\phi_{21}-180°$, respectively; the f3 and f4 component voltage levels of signal S5 are $C_{22}V_3$ and $C_{22}V_4$, respectively, at respective phases of $-\phi_{31}-180°$ and $-\phi_{41}-180°$.

Signal S6 flowing into input port 27 of coupler C3 is essentially signal S2 delayed by delay line DLI. Advantageously, delay line DLI, which may be a fixed length of microstrip transmission line, is designed to introduce phase lags of $-\phi_{11}$ and $-\phi_{21}$ at frequencies f1 and f2, respectively. These phase lag values equal the combination of insertion phase lags through amplifier A1 and coupler C2 at the corresponding frequencies f1 and f2. As a result, the f1 and f2 frequency components of signal S6 are 180° out of phase with the corresponding frequency components of signal S5 in the present example.

An important aspect of the present invention resides in the operation of coupler C3, which is preferably designed to substantially subtract signal S5 from signal S6 to provide signal S7 which has the frequency components f1–f4. In the exemplary case, the f1 and f2 components of signal S7 have phase values equal to the phase of the respective f1 and f2 components of signal S6 delayed by 90° —that is, $-\phi_{11}90°$, and $-\phi_{21}-90°$, respectively. It is understood that other phase values for signal S7 can be used, depending on the type of coupler C3 employed and its electrical length. (Whatever absolute phase value results must be appropriately compensated for in the electrical path in which signal S8 flows). Due to the subtraction operation, the voltage levels of the f1 and f2 components of signal S7 will be ($\sqrt{1-C_{22}^2}$ $\sqrt{1-C_{11}^2}$ $-C_{33}C_{11}C_{22}G1$) times $V_1$ and $V_2$, respectively, where $C_{33}$ represents the coupling value of coupler C3. These voltage values must be positive in order to attain the above phase values—otherwise, the signal S7 phases will be flipped by 180°. Coupler C3 also operates to provide the f3 and f4 components of signal S7 at voltage levels of $C_{33}C_{22}V_3$ and $C_{33}C_{22}V_4$, respectively, and at phase values of $-\phi_{31}270°$ and $-\phi_{41}-270°$, respectively.

The above amplitude and phase relationships for the frequency components of signal S7 can be realized by employing a conventional directional coupler for coupler C3, having input, output, coupled and isolation ports, as is well known in the art. The orientation of a conventional coupler within circuit 10 would be with the input port connected to line 27, the isolation port connected to line 29, the direct path output port connected to line 31 and the coupled path output port terminated in a matched load. This arrangement is that of a conventional subtracter. Examples of suitable directional couplers which can be used for this purpose include "in-phase" type couplers, and hybrids such as branch-line or rat-race couplers. If a hybrid is used, the additional 90° phase delay inherent therein must be accounted for.

The fundamental frequency components at f1 and f2 of signal S7 will differ in phase from the corresponding frequency components of signal S8 by 90°, whereas the distortion frequency components at f3 and f4 of signal S7 will differ in phase from the corresponding distortion frequency components of S8 by 270°. This amounts to a 180° difference between the relative phases of the fundamental components of the two signals S7 and S8, with respect to the relative phases of the corresponding distortion components of the two signals S7 and S8. As will be seen, this 180° difference in the relative phase relationships will enable the distortion components to be cancelled while the fundamental components are combined to yield higher output power.

With continuing reference to FIGS. 2–4, the voltage or power level of signal S7 at f1 and f2 is preferably slightly below that of signal S1. Specifically, the fundamental frequency components of signal S7 that are applied to amplifier A2, are preferably at voltage levels equal to $\sqrt{1-C_{22}^2}$ times the voltage levels of signal S1 at the corresponding frequencies. With this approach, the gain G2 of amplifier A2 may be advantageously selected to equal the gain G1 of amplifier A1, so that equal power can be applied to both inputs of an output combiner 39 to be described below. Identical or highly similar parts may then be used for amplifiers A1 and A2 with gain and insertion phase characteristics that track each other over temperature and bias supply variations. Consequently, superior temperature stability for the circuit is obtainable. By selecting coupling values $C_{11}$ and $C_{22}$ and gain G1=G2 appropriately, the above voltage relationship between signals S7 and S1 will occur when the following equation (ignoring power losses and VSWR losses) is satisfied:

$$\sqrt{1-C_{22}^2}\sqrt{1-C_{11}^2} - C_{33}C_{11}C_{22}G1 = C_{11}\sqrt{1-C_{22}^2}. \qquad (1)$$

Equation (1) can readily be derived from the voltage levels tabulated in FIGS. 3 and 4.

Whether or not the voltage levels of signal S7 are selected to satisfy the above-described relationship, signal S7 containing frequencies f1–f4 is amplified by amplifier A2 at a gain G2 to produce an amplified signal S9. The phases of the f1 to f4 components of signal S9 equal $(-\phi_{11}-90-\phi_{A21})$; $(-\phi_{21}-90-\phi_{A22})$; $(-\phi_{31}-270-\phi_{A23})$; and $(-\phi_{41}270-\phi_{A24})$, respectively, in degrees, where $-\phi_{A21}$ to $-\phi_{A24}$ are the insertion phase lags through amplifier A2 at respective frequencies f1 to f4.

Signal S9 will also contain distortion components designated "f3,S9" and "f4,S9" at respective distortion frequencies f3 and f4, which are primarily the result of the amplification of the corresponding distortion frequency components of signal S7. In addition, a signal S10 which is signal S8 delayed by a delay line DL2, will contain distortion frequency components "f3,S10" and "f4,S10" at respective frequencies f3 and f4. Signal S10 will also contain fundamental frequency components "f1,S10" and "f2,S10" at respective frequencies f1 and f2. Preferably, the voltage levels of f1,S9 and f2,S9 equal those of f1,S10 and f2,S10, respectively. This can be accomplished by using approximately the same gain for amplifiers A1 and A2 as explained above. Moreover, the voltage level of f3,S9 preferably equals that of f3,S10 and the voltage level of f4,S9 preferably equals that of f4,S10. The phases of f3,S9 and f4,S9 advantageously differ by 180° from those of f3,S10 and f4,S10, respectively, while the phases of f1,S9 and f2,S9 advantageously equal those of f1,S10 and f2,S10 respectively.

The foregoing phase and amplitude relationships for the S9 and S10 signals are illustrated in detail in FIG. 4 where it is seen that the voltage levels of f1,S9 and f2,S9 equal ($\sqrt{1-C_{11}^2}$ $\sqrt{1-C_{23}^2}-C_{33}C_{11}$ $C_{22}$ G1) G2 times $V_1$ and $V_2$, respectively, whereas the voltage levels of f1,S10 and f2,S10 are $G1C_{11}\sqrt{1-C_{22}^2}$ times $V_1$ and $V_2$, respectively. The f1 and f2 frequency components will then add in output combiner 36 when the phases of f1,S9 and f2,S9 equal those of f1,S10 and f2,S10, respectively, and when the corresponding voltage levels of S9 and S10 are equal. Delay line DL2 functions to equalize the above phases by introducing an insertion phase lag which matches the insertion phase delay though amplifier A2 and through the path between ports 27 and 31 of coupler C3. Delay line DL2 may be a simple, fixed length of transmission line such as a microstrip line to provide the required phase delays as a function of frequency. The insertion phases of the transmission line connections between the various components will also have to be compensated for by delay line DL2 such as the connections between phase shifter 28 and port 29 of coupler C3; between port 31 of coupler 35 and the amplifier A2 input, and so on.

Delay line DL2 also compensates for the insertion phases of the distortion products of signal S5 through coupler C3, and for those of signal S7 at f3 and f4 through amplifier A2. In the simplest case, this can be accomplished with delay line DL2 embodied as a fixed length of transmission line. However, the f3,S9 and f4,S9 signal energy results from the combination of: 1) the amplification of the f3,S7 and f4,S7 signal components; and 2) the new generation of distortion products at f3 and f4 due to intermodulation distortion inherent in the amplification of the f1,S7 and f2,S7 signal components. With some amplifiers, this new IMD power can be simply subtracted from the amplified f3,S7 and f4,S7 power to produce a desired amount of distortion power. In other words, the new IMD products will be approximately 180° out of phase with the S9 components at f3 and f4 that results from the amplification of f3,S7 and f4,S7. In this case, assuming G2=G1, the voltage levels of f3,S7 and f4,S7 should be set higher than $V_3/G2$ and $V_4/G2$, respectively. Then, the voltage levels of f3,S9 and f4,S9 can be designed to equal those of f3,S10 and f4,S10, respectively—i.e., $v_3\sqrt{1-C_{22}^2}$ $v_4\sqrt{1-C_{22}^2}$, respectively. Proper selection of coupling values $C_{22}$ and $C_{33}$ and gain G2 will enable these voltage levels to be attained.

In any event, amplifier A2 preferably has linear insertion phase characteristics resembling that of a fixed length of transmission line over the frequency band encompassing f1 to f4, even when taking into account the IMD product generation at f3 and f4. In this case, delay line DL2 will advantageously be a fixed length of transmission line. In some instances, however, the new IMD product generation within amplifier A2 will prevent amplifier A2 insertion phase from being linear at frequencies f3 to f4. This may be compensated for by changing the relative phase relationship of the S7 signal components relative to the corresponding components of the S8 signal. That is, the phases of the f1,S7 and f2,S7 signal components in the current example will need to be set to values other than $-\phi_{11}-90°$ and $-\phi_{21}-90°$, respectively, while those of the f3,S7 and f4,S7 components remain at $-\phi_{31}-270°$ and $-\phi_{41}-270°$, respectively. Independent control of the f1,S7 and f2,S7 relative phases with respect to those of f3,S7 and f4,S7 can be achieved by independently controlling the phase of the S6 signal via the delay line DLI. Changing the S6 signal phases to be other than 180° from the S5 signal phases at the corresponding frequencies, will produce the desired phase change in f1,S7 and f2,S7. However, the voltage levels of f1,S7 and f2,S7 will change accordingly due to the vectorial subtraction of S5 from S6. The S7 voltage level changes must then of course be compensated for by varying the coupling values of the various couplers or otherwise.

With the above-described set of voltage and phase relationships, output combiner 36 is employed to receive signals S9 and S10 at ports 39 and 38, respectively. Combiner 36, which is preferably a 3 dB Wilkinson type coupler, cancels the distortion frequency power within signals S9 and S10 by dissipating the energy at these frequencies in its internal load resistor. With combiner 36 embodied as a conventional 3 dB Wilkinson coupler, ports 38 and 39 are the outputs of the two 70.7 ohm branch lines of the coupler, and the port 40 is the input to the 50 ohm input port of the coupler. When two equal amplitude but out of phase signals and applied to the branch arms of a 3 dB Wilkinson coupler, all the power within the signals is dissipated within the load resistor therein. Similarly, when two equal amplitude but in-phase components are applied to ports 38 and 39, all the power appears at the input port 40. Consequently, an output signal $S_{out}$ flowing out of port 40 has voltage levels of 1.414 $G1C_{11}\sqrt{1-C_{22}^2}$ times $V_1$ and $V_2$ at frequencies f1 and f2, respectively, and is without distortion components at frequencies f3 and f4 in the ideal case. Accordingly, $S_{out}$ has in the ideal lossless case, twice the fundamental frequency output power as compared to the prior art feed forward amplifiers discussed previously which employed a correction amplifier only to generate distortion frequency correction signals. It is noted that manufacturing tolerances in the various components of circuit 10 will prevent total cancellation of the distortion products at f3 and f4 and power losses will prevent a complete 3 dB improvement in output power.

It should be noted that very low level additional distortion products at frequencies lower and higher than f3 and f4, respectively, may be generated by amplifier A2 due to IMD product generation inherent in the simultaneous amplification of f3,S7 and f4,S7. These additional distortion products will appear as part of signal $S_{out}$ after being attenuated somewhat by the Wilkinson combiner 36.

While in the preferred embodiment, a 3 dB Wilkinson combiner 36 is employed, it is understood that unequal power splitting/combining couplers could be employed for combiner 36 if the voltage levels of signal S9 frequency components are designed to be unequal to those of the corresponding frequency components within signal S10. Suitable couplers for this purpose would include unequal splitting Wilkinson type couplers and branch-line couplers.

An amplifier circuit in accordance with circuit 10 of FIG. 2 was built and measured with multi-tone inputs over the frequency range of 870–890 MHz. Measured results indicate an improvement in IMD levels from −36 dBc for the main amplifier (without the correction amplifier), to −64 dBc with the correction amplifier in the feed forward loop. Output power of this amplifier circuit measured 2.7 dB higher than that of the main amplifier itself.

From the foregoing, thus disclosed are embodiments of a feed-forward amplifier circuit in accordance with the present invention for amplifying a single or multi-tone input signal in a substantially distortion-free manner. A key advantage of the amplifier circuit disclosed herein over feed-forward distortion cancellation amplifiers of the prior art, is that an error correction amplifier is employed to simultaneously provide correction signals at unwanted distortion frequencies to allow for distortion component cancellation, and also to provide additional fundamental frequency power to substantially increase the overall power of the amplifier circuit.

It will be understood that the embodiments described herein are merely exemplary and that a person skilled in the art can make many modifications and variations to the disclosed embodiments without departing from the spirit and scope of the invention. All such variations and modifications are intended to be included within the scope of the invention as defined by the appended claims.

What is claimed is:

1. An amplifier circuit capable of amplifying an input signal having signal energy of at least one fundamental frequency to provide a low distortion output signal, comprising:

a first coupler for splitting said input signal into first and second signals, said first signal having a first phase and a second phase, where said first phase is equal to said second phase;

a first amplifier for amplifying said first signal to produce a first amplified signal having signal energy of a first power level at said at least one fundamental frequency and power of a first distortion power level at at least one distortion frequency;

a second coupler for splitting said first amplified signal into a coupled signal and a direct signal;

a third coupler for subtracting signal energy of said coupled signal from signal energy of said second signal to provide a third signal having signal energy at said at least one fundamental frequency and power at said at least one distortion frequency;

a second amplifier for amplifying said third signal to provide a second amplified signal having signal energy of substantially said first power level at said at least one fundamental frequency and power of substantially said first distortion power level at said at least one distortion frequency; and a combiner for combining signal energy of said second amplified signal at said at least one fundamental frequency with signal energy of said direct signal at said at least one fundamental frequency to produce said output signal, and for canceling power of said second amplified signal and of said direct signal at said at least one distortion frequency, such that said output signal is substantially devoid of power at said at least one distortion frequency, and contains signal energy of a second power level substantially twice said first power level at said at least one fundamental frequency.

2. The amplifier circuit according to claim 1 further comprising a phase shifter coupled between said second coupler and said third coupler for phase shifting said coupled signal to enable signal energy of said coupled signal at said at least one fundamental frequency to be applied to said combiner at a phase substantially 180° from the phase of signal energy of said second signal applied to said third coupler at said at least one fundamental frequency.

3. The amplifier circuit according to claim 2 further comprising a delay line coupled between said first and third couplers, for compensating for phase of said coupled signal as a function of frequency, thereby enabling signal energy of said coupled signal at a plurality of fundamental frequencies to be applied to said third coupler at a phase substantially 180° from the phase of signal energy of said second signal at each of said plurality of fundamental frequencies.

4. The amplifier circuit according to claim 1, wherein said first amplifier amplifies said first signal at a first gain and said second amplifier amplifies said third signal at a second gain substantially equal to said first gain.

5. The amplifier circuit according to claim 1, wherein said second amplifier has an input port for receiving said third signal and wherein said signal energy at said at least one fundamental frequency of said third signal differs in phase with signal energy at said at least one fundamental frequency of said direct signal by a first predetermined relative phase, and wherein said power at said at least one distortion frequency of said third signal differs in phase from corresponding distortion power of said direct signal by a second predetermined relative phase, said third signal thereby having a first given phase relationship between said first predetermined phase and said second predetermined phase, wherein amplification by said second amplifier of said third signal having said first given phase relationship provides said second amplified signal at a second given phase relationship with respect to said direct signal to enable said combiner to combine fundamental frequency signal energy while canceling distortion frequency power.

6. The amplifier circuit according to claim 5 wherein said second predetermined phase differs from said first predetermined phase by substantially 180°.

7. The amplifier circuit according to claim 5, wherein said first amplifier amplifies said first signal at a first gain and said second amplifier amplifies said third signal at a second gain substantially equal to said first gain, and wherein energy of said third signal at said at least one distortion frequency is at a third amplitude higher than amplitude of said first amplified signal at said at least one distortion frequency divided by said second gain.

8. The amplifier circuit according to claim 1 further comprising a delay line coupled between said second coupler and said combiner, for delaying phase of said direct signal to enable signal energies of said direct signal at a plurality of fundamental frequencies to be applied to said combiner substantially in phase with signal energies of said second amplified signal at corresponding frequencies to each of said plurality of fundamental frequencies.

9. The amplifier circuit according to claim 8, wherein said delay line enables power of said direct signal at a plurality of distortion frequencies to be applied to said combiner substantially 180° out of phase with energy of said second amplified signal at corresponding frequencies to said plurality of distortion frequencies of said second amplified signal.

10. The amplifier circuit according to claim 1 wherein power of said direct signal at said at least one distortion frequency is applied to said combiner at a third amplitude level and wherein power of said second amplified signal at said at least one distortion frequency is applied to said combiner at a fourth amplitude substantially equal to said third amplitude.

11. The amplifier circuit according to claim 1 wherein said combiner comprises an even power combining Wilkinson type coupler.

12. The amplifier circuit according to claim 1, wherein:

voltage levels of said direct signal are substantially $\sqrt{1-C_{22}^2}\ G1C_{11}V_1$; $\sqrt{1-C_{22}^2}\ G1C_{11}V_2$; $\sqrt{1-C_{22}^2}V_3$; and $\sqrt{1-C_{22}^2}V_4$ at frequencies f1, f2, f3 and f4, respectively, where frequencies f1 and f2 are respective first and second fundamental frequencies of said input signal; f3 and f4 are distortion frequencies of said first amplified signal; $V_1$ and $V_2$ are respective voltage levels of said input signal at frequencies f1 and f2; $V_3$ and $V_4$ are respective voltage levels of said first amplified signal at frequencies f3 and f4; G1 is the gain of said first amplifier; $C_{11}$ and $C_{22}$ are the coupling values of said first and second couplers, respectively;

phase values of said direct signal at frequencies f1–f4 are $-\phi 11$; $-\phi 21$; $-\phi 31$ and $-\phi 41$; respectively;

voltage levels of said third signal at frequencies f1 and f2 are $(\sqrt{1-C_{33}^2}\sqrt{1-C_{11}^2}-C_{33}C_{22}C_{11}G1)$ times $V_1$ and $V_2$, respectively, where $C_{33}$ is the coupling value of said third coupler;

voltage levels of said third signal at frequencies f3 and f4 are $C_{33}C_{22}$ times $V_3$ and $V_4$, respectively; and phase values of said third signal, in degrees, at frequencies f1–f4 are $-\phi 11\ -X$; $-\phi 21\ -X$; $-\phi 31\ -X\ -180$; and $-\phi 41\ -X\ -180$, respectively, where X is a constant phase value.

13. The amplifier circuit according to claim 1, wherein said first and second amplifiers are substantially identical amplifiers having substantially the same gain and further wherein said third signal has fundamental frequency power levels substantially equal to corresponding fundamental frequency power levels of said first signal;

whereby output power of said first and second amplifiers substantially track each other over temperature and bias supply variations.

14. The amplifier circuit according to claim 13, wherein said second signal is of a power level in the range of about one dB to ten dB higher than a power level of said first signal.

15. A method of amplifying an input signal having signal energy of at least one fundamental frequency to provide a low distortion output signal, said method comprising:

splitting said input signal into first and second signals, said first signal having a first phase and a second phase, where said first phase is equal to said second phase;

amplifying said first signal to produce a first amplified signal having signal energy of a first power level at said at least one fundamental frequency and powers of a first distortion power level at at least one distortion frequency;

splitting said first amplified signal into a coupled signal and a direct signal;

subtracting said coupled signal from said second signal to provide a third signal having signal energy at said at least one fundamental frequency and power at said at least one distortion frequency and amplifying said third signal to provide a second amplified signal of substantially said first power level at said at least one fundamental frequency and having power of substantially said first distortion power level at said at least one distortion frequency;

combining signal energy of said second amplified signal at said at least one fundamental frequency with signal energy of said first amplified signal at said at least one fundamental frequency to produce said output signal at a second power level substantially twice said first power level; and canceling substantially all power of said second amplified signal and of said direct signal at said at least one distortion frequency, whereby said output signal consists substantially of signal energy at said at least one fundamental frequency.

16. The method according to claim 15, further comprising:

providing said second signal with signal energy at said at least one fundamental frequency which differs in phase from corresponding signal energy of said first amplified signal by a first predetermined relative phase; and providing said second signal with power at said at least one distortion frequency which differs in phase from corresponding power of said first amplified signal by a second predetermined phase, said second signal thereby having a first given phase relationship between said first predetermined relative phase and said second predetermined relative phase, wherein said amplifying of a second signal provides said second amplified signal at a second given phase relationship with respect to said first amplified signal to enable said combining of fundamental frequency signal energy and said canceling of distortion frequency power, substantially twice said first power level at said at least one fundamental frequency.

17. The method according to claim 15, wherein said first and second amplifiers are substantially identical amplifiers having substantially the same gain and further wherein said third signal has fundamental frequency power levels substantially equal to corresponding fundamental frequency power levels of said first signal;

whereby output power of said first and second amplifiers substantially track each other over temperature and bias supply variations.

18. The method according to claim 17, wherein said second signal is of a power level in the range of about one dB to ten dB higher than a power level of said first signal.

* * * * *